United States Patent [19]
Schmookler

[11] Patent Number: 5,528,601
[45] Date of Patent: Jun. 18, 1996

[54] SCANNABLE LATCH FOR MULTIPLEXOR CONTROL

[75] Inventor: Martin S. Schmookler, Austin, Tex.

[73] Assignee: International Business Machines Corporation, Armonk, N.Y.

[21] Appl. No.: 308,007

[22] Filed: Sep. 16, 1994

[51] Int. Cl.⁶ .................................................... G06F 11/00
[52] U.S. Cl. ............................................ 371/22.3; 371/27
[58] Field of Search .................................. 371/22.3, 22.1, 371/22.6, 27; 324/73.1, 158 R

[56] References Cited

U.S. PATENT DOCUMENTS

| | | |
|---|---|---|
| 4,581,739 | 4/1986 | McMahon, Jr. . |
| 4,602,210 | 7/1986 | Fasang et al. . |
| 4,780,874 | 10/1988 | Lenoski et al. . |
| 4,870,345 | 9/1989 | Tomioka et al. . |
| 4,980,889 | 12/1990 | DeGuise et al. . |
| 5,252,917 | 10/1993 | Kadowaki . |
| 5,410,551 | 4/1995 | Edwards et al. ................. 371/22.3 |

FOREIGN PATENT DOCUMENTS 62-267678  11/1987  Japan .

Primary Examiner—Vincent P. Canney
Attorney, Agent, or Firm—Mark E. McBurney; Keith L. Hargrove; Andrew J. Dillon

[57] ABSTRACT

An improved test circuit and method for integrated circuits are disclosed. The test circuit uses a level sensitive scan design for use with a multiplexor having a plurality of pass gates. The test circuit includes a plurality of latches, each having a functional input, a scan input and an output. The outputs are coupled to the multiplexor pass gates. A first set of mutually exclusive, or orthogonal, signals is placed on the functional inputs of the latches for selecting one of the pass gates. A signal encoder is used to form a reduced set of signals, based on the first set of signals. The reduced set of signals is further modified by a modifying means, such as a shift register. The modified signal is then decoded by a decoding means for generating the next set of orthogonal signals placed on the scan inputs. Also, an output signal is then transmitted as an evaluation signal to confirm the accuracy of the integrated circuit.

8 Claims, 2 Drawing Sheets

SCANNABLE LATCH FOR MULTIPLEXOR CONTROL

BACKGROUND OF THE INVENTION

1. Technical Field

The present invention relates to an integrated circuit with integrated testing circuits, and, more particularly, to a chip level diagnostic apparatus incorporating a scan design integrated latch-based system.

2. Description of the Related Art

The testing of the integrated circuits is well known in the art. Testing is necessary so chip designers can be assured that their designs work properly. The designers desire observability, which refers to the ease with which the state of internal signals in the IC can be determined. Furthermore, the designers require controllability, which refers to the ease of producing a specific internal signal value. Designers obtain observability or controllability in a circuit design by introducing test points, or additional circuit inputs and outputs, into the chip for use during testing. For circuit boards, the cost of test points is often well justified. On the other hand, the cost of test points for ICs can be prohibitive because of IC pin limitations. Consequently, techniques have evolved that use scan paths to provide access to the internal nodes of a circuit without requiring a separate external connection for each node accessed.

In the scan path technique, a circuit is designed so that it has two modes of operation: one that is the normal functional mode, and the other that is the test mode, in which circuit memory (storage) elements, typically combinational circuitry input and output storage elements, are interconnected into a shift register chain for forming scan units associated with each set of combinational logic. With the circuit in a test mode, it is possible to shift an arbitrary test pattern into the input elements. By returning the circuit to a normal mode, the combinational circuitry can act upon the shift register contents and then store the results in the output elements. If the circuit is then placed into a test mode, it is possible to shift out the contents of the shift register and compare the contents with the correct response. One way of implementing a scan path is to interconnect the circuit flipflops to form a shift register.

One example of the scan path technique is "level sensitive scan design" (LSSD), used by International Business Machines Incorporated (IBM). Unfortunately, LSSD scan paths also have certain limitations. One limitation is that with LSSD design, any random pattern of values may appear in the latches, both during the scanning operation and as input values for any test. These random patterns, however, may not be permitted at certain times. The most common case is when the latches hold control signals to a pass-gate multiplexor (MUX). These signals must be mutually exclusive or else an excessive amount of current may conduct, possibly causing damage, since one selected gate may be pulling a node towards a VDD voltage while another is pulling it down to ground. Even if no damage occurs, the node may have an indeterminate value, so that the output values cannot be predicted for that test.

Similarly, if none of the control signals is active, then none of the gates is selected and the internal node may be in a high impedance mode, which is also indeterminate. While such indeterminate values can either be avoided or ignored by software programs, which generate the test, such indeterminate values can neither be prevented nor ignored when the latches are scanned during self-test operations. A set of signals that are mutually exclusive, such that one and only one is active at any time, are said to be "orthogonal".

Accordingly, what is needed is an LSSD logic that does not affect the functional behavior of the circuits, but which does affect the behavior during scanning. Additionally, the LSSD logic must not affect the speed of the chip during normal functional operations. Further, the LSSD logic must minimize the amount of chip real estate normally taken for the testing devices implemented thereon.

SUMMARY OF THE INVENTION

It is therefore one object of the present invention to provide a diagnostic apparatus for a data processing system.

It is another object of the present invention to provide a chip level diagnostic apparatus incorporating a scan design into a latch-based system.

It is yet another object of the present invention to provide an improved level sensitive scan design for scanning any set of latches on an integrated circuit that are limited to only a restricted pattern, but not necessarily those requiring an orthogonal pattern.

According to the present invention, an improved scannable latch for integrated circuits is disclosed. The scannable latch uses a level sensitive scan design for use with a multiplexor having a plurality of pass gates. The circuit includes a plurality of latches, each having a functional input, a scan input and an output. The outputs are coupled to the multiplexor pass gates. A first set of mutually exclusive, or orthogonal, signals is placed on the functional inputs of the latches for selecting one of the pass gates. A signal encoder is used to form a reduced set of signals, based on the first set of signals. The reduced set of signals is further modified by a modifying means, such as a shift register. The modified signal is then decoded by a decoding means for generating the next set of orthogonal signals placed on the scan inputs. Also, an output signal is then transmitted as an evaluation signal, which is compared to an expected value to confirm the accuracy of the integrated circuit. The functional outputs of the latches are connected so as to bypass the encoder when the integrated circuit is not in the test mode.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF SPECIFIC EMBODIMENTS

For illustrative purposes, a first embodiment of the present invention is based on a set of signals that corresponds to a full decode of N signals. In this case, the number of signals is a power of 2, or $2^N$. Exactly one of these signals may be active at any time. Therefore, they are said to be "mutually exclusive" or "orthogonal".

Figure 1:
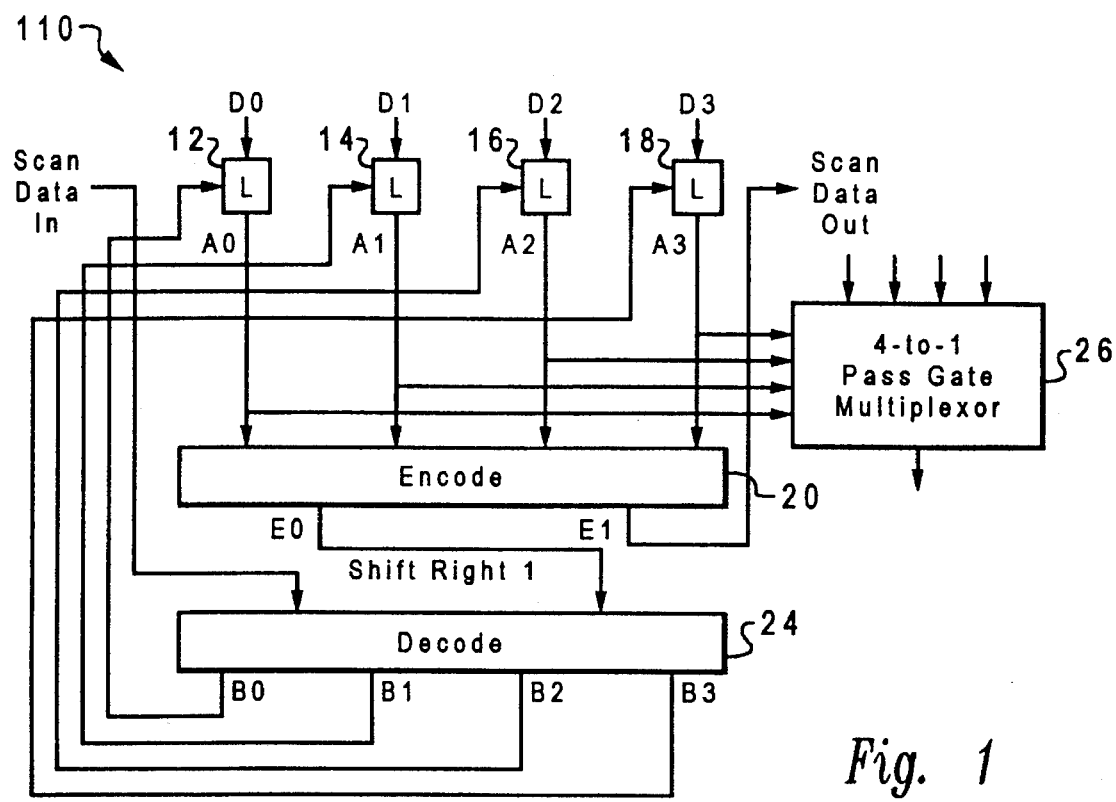
FIG. 1 is a block diagram of a level sensitive scan design (LSSD) logic circuit according to the present invention.
Figure 2:
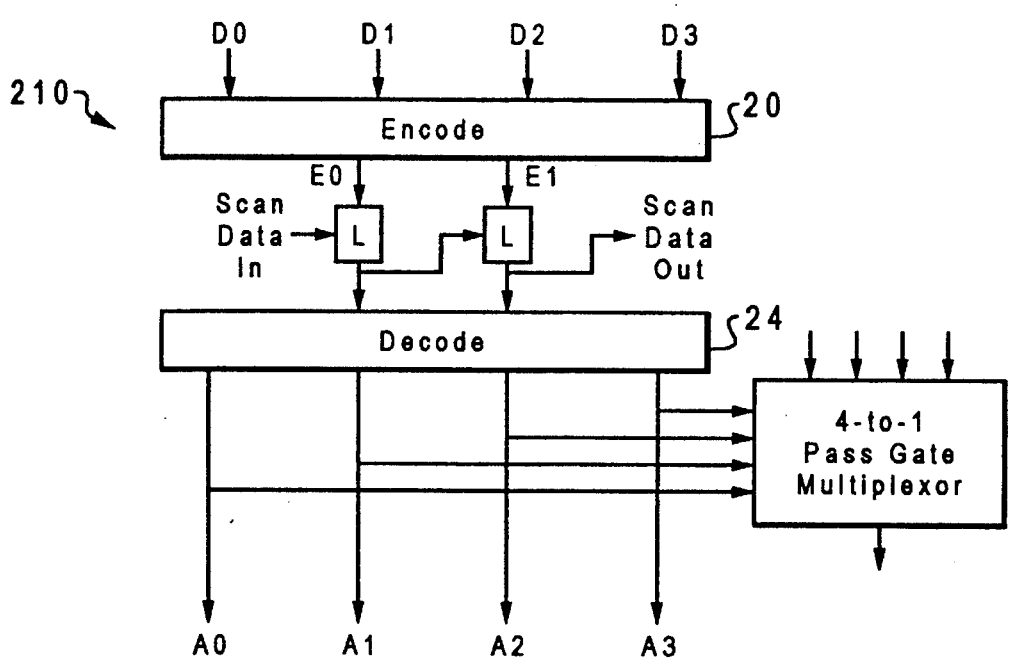
FIG. 2 is a block diagram of a functionally equivalent logic model of the circuit shown in FIG. 1, and has been reduced to a two-latch design.

FIG. 1 is a block diagram of a level sensitive scan design circuit 110 having four latches 12, 14, 16, and 18. FIG. 2 is a logical equivalent of FIG. 1. Each latch 12–18 holds a respective orthogonal signal D0–D3. The input signals to the latches 12–18 come in on lines D0–D3 while the outputs are generated on A0–A3. Scan inputs into the latches are provided on lines B0–B3. The functional inputs D0–D3 can be encoded as two independent signals E0 and E1, which are shown in FIG. 2. The outputs A0–A3 feed to encode circuit 20, which has its outputs shifted right by one before proceeding to a decode circuit 24, which generates the scan inputs B0–B3. In the process of shifting the data signals, the data being scanned in replaces the signal on the left and the signal shifted out at the right is the data being scanned out of the circuit.

FIG. 1 further illustrates a four to one pass gate multiplexor 26, which couples to the latches in such a way so as to bypass the encoder and remaining LSSD circuitry used only during testing operations. The latches are used to select one of four sets of data in the multiplexor. The bypassing of the encoding circuit prevents the LSSD test circuit from corrupting data passing through the multiplexor and from having to go through unnecessary stages that would otherwise slow down the performance of the multiplexor or integrated circuit.

FIG. 2 is now described. Functionally, the LSSD circuit 110 of FIG. 1 behaves as if it has only two independent latches 30 and 32. In this arrangement, functional inputs D0–D3 enter in the encode circuit 20, which acts on these signals to generate the two independent signals E0 and E1. Each encoded signal E0 and E1 is fed to its respective latch 30 and 32. During scan operations used in testing, data scans into and out of the latches upon the completion of each clock cycle. The output from each latch 30 and 32 feeds to the decode circuit 24 before generating the outputs A0–A3. The logical model of FIG. 2 can be used as the behavioral model for test generation. This is applicable for testing to be implemented in software.

Importantly, FIG. 1 is merely an example of the implementation, the separate encode and decode circuits are optional.

The output signals of FIG. 1 of the scan design, B0–B3 are easily derived as direct Boolean functions of the inputs A0–A3 and the scan data in (SDI). One example of a first set of Boolean equations is:

$B0=\overline{SDI}(\overline{A2*A3})$ $B1=\overline{SDI}(A2+A3)$ $B2=SDI(\overline{A2*A3})$ $B3=SDI(A2+A3)$ Also, the Boolean equation for scan data out (SDO) is:

$SDO=A1+A3$

The two models may only behave the same when both the inputs D0–D3 and the contents of the latches in FIG. 1 are orthogonal. This may not be true when there is an error or when the power is first turned on and the latch contents are not predictable. It is important, however, to make sure that the circuit is well behaved even when such cases occur as is described below.

When determining the Boolean functions for the B0–B3 outputs, an important factor is that the signals A0–A3 are orthogonal. For example, under such circumstances, this leads to the following equality:

$(\overline{A2*A3})=(A0+A1)$.

Accordingly, the Boolean equations may be rewritten as follows:

$B0=\overline{SDI}(A0+A1)$ $B1=\overline{SDI}(A2+A3)$ $B2=SDI(A0+A1)$ $B3=SDI(A2+A3)$.

Unfortunately, there may arise a spurious error, such as all latches are zeros, which leads to all of the scan outputs B0–B3 to be equal to zero. In this situation, the latches remain in that state throughout scanning, thus preventing the scanout of other latches in the same chain. This situation is unacceptable. Accordingly, the functions for B0–B3 must be generated in such a way that ensures that at least one latch is always turned on during scanning. Furthermore, different latches should be turned on when SDI is 1 from when SDI is 0, so that no data being scanned through these latches is lost. Notice that in the first set of equations, if all four latches have zeros, then B0=1 when SDI is zero and B2=1 when SDI=1.

An alternative embodiment of the present invention considers when the number of orthogonal signals is not a power of 2. In this case, the set of signals, by themselves, cannot be made equivalent to an encoded set of N latches. This is because random patterns being scanned into or through the encoded latches in the test model will create $2^N$ different combinations and the real model must provide a unique encoding for each combination. This problem, however, can be overcome by adding just one additional latch, so that in conjunction with the orthogonal signals, they can be encoded in N latches. This is illustrated in FIGS. 3 and 4.

Figure 3:
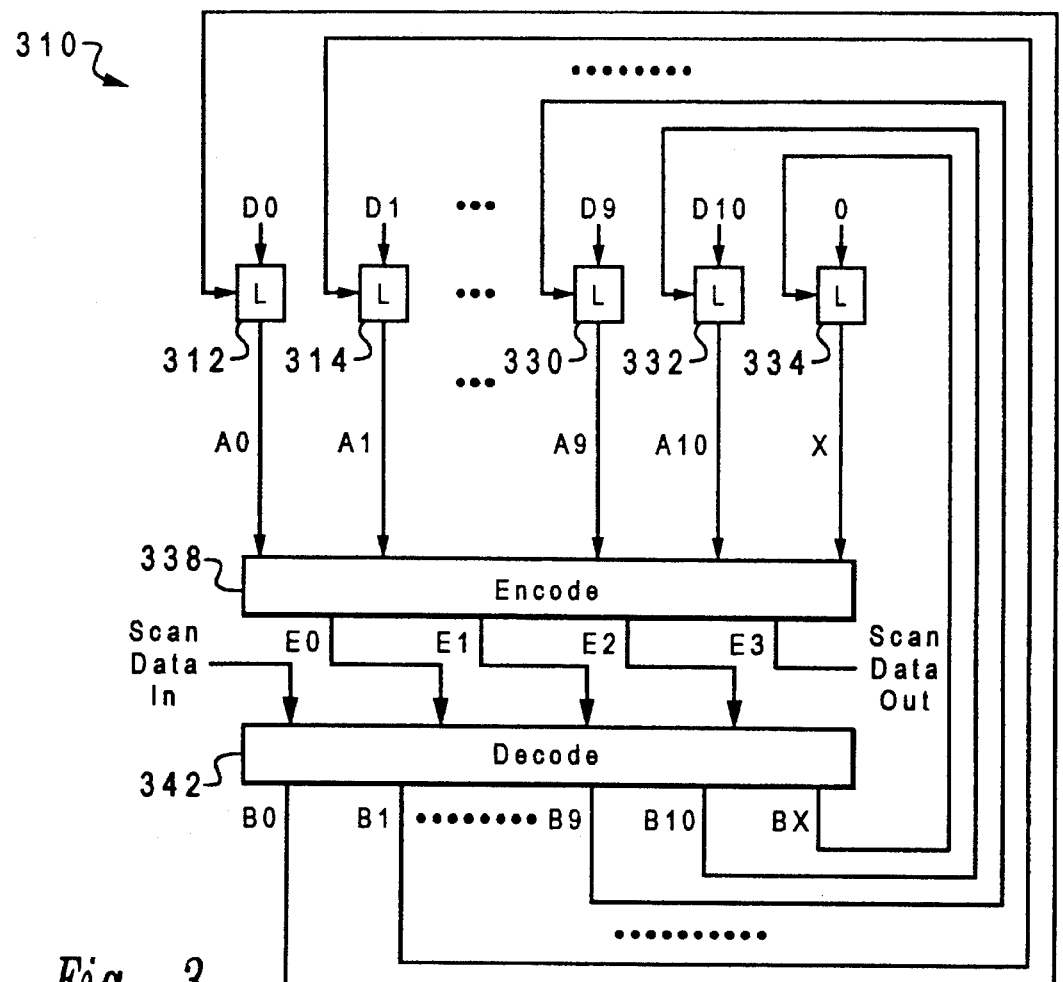
FIG. 3 depicts a second embodiment to the LSSD integrated circuit according to the present invention.
Figure 4:
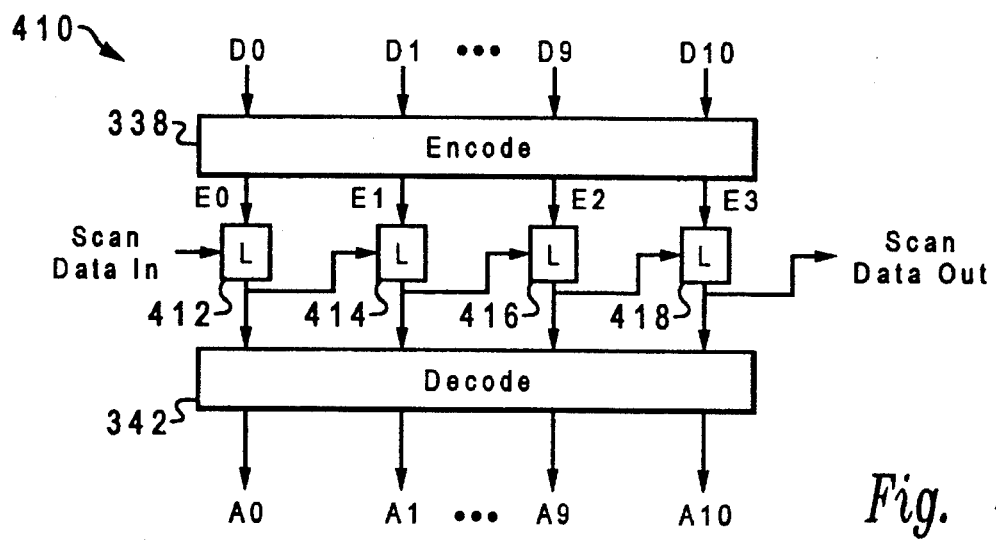
FIG. 4 depicts a block diagram of a functionally equivalent logic model based on the circuit of FIG. 3, which circuit is reduced to a four-latch design.

FIG. 3 depicts a block diagram of an LSSD circuit 310 substantially similar to that of FIG. 1. The LSSD circuit 310 includes 11 latches 312–332, which hold orthogonal signals D0–D10, respectively. These orthogonal signals can be encoded as four independent signals E0–E3, which is shown in FIG. 4. Since random patterns may scan any values into the behavioral model, it is necessary to provide a way of representing all 16 possible states in the hardware. Accordingly, an additional latch 334 is added, which has no functional input or output, but which has scan-in and scan-out signals. The latches 312–332 have scan inputs B0–B10, respectively, and outputs A0–A10, respectively. The additional latch 334 has scan input BX and output AX. The outputs A0–AX are fed to encode circuit 338. The encoded signals E0–E3 are shifted right by one before feeding to decode circuit 342, which generates the scan inputs B0–B3. The data being scanned in replaces the signal on the left, and the signal E3, which is shifted out at the right, is the data being scanned out of the circuit. While there are many possible encodings, one appearing to have the simplest Boolean function is shown in Table I.

TABLE I

| STATE | ENCODING FROM SCAN-IN | ACTIVE CONTROL LATCH OUTPUT | X-LATCH |
|---|---|---|---|
| 0 | 0000 | A0 | 0 |
| 1 | 0001 | A1 | 0 |
| 2 | 0010 | A2 | 0 |
| 3 | 0011 | A3 | 0 |
| 4 | 0100 | A4 | 0 |
| 5 | 0101 | A5 | 0 |
| 6 | 0110 | A6 | 0 |
| 7 | 0111 | A7 | 0 |
| 8 | 1000 | A8 | 0 |
| 9 | 1001 | A9 | 0 |
| 10 | 1010 | A10 | 0 |
| 11 | 1011 | A3 | 1 |
| 12 | 1100 | A4 | 1 |
| 13 | 1101 | A5 | 1 |
| 14 | 1110 | A6 | 1 |
| 15 | 1111 | A7 | 1 |

States 11 through 15 can only occur during scan-in, not during logic operations.

Table II shows the derivation of a possible set of Boolean functions for inputs B0–B10, which takes advantage of the orthogonality of outputs A0–A10. Table II also shows two possible forms for B0 and B8. The second form requires more circuitry, but ensures that either B0 or B8 will be active if all the latches contain zeros, and therefore, at least one of B0–B8 will be active regardless of the state of the latches.

TABLE II

Derive equations for scan inputs to 11 orthogonal latches by doing encode, shift, and decode functions Encode  
$E0 = A8 + A9 + A10 + X$  
$E1 = A4 + A5 + A6 + A7$  
$E2 = A2 + A3 + A6 + A7 + A10$  
$E3 = A1 + A3 + A5 + A7 + A9$ Shift by 1  $SDI, E0, E1, E2,$ Scan Data Out $= E3$ Decode  
$B0 = \overline{SDI} * \overline{E0} * \overline{E1} * \overline{E2} = \overline{SDI} * (A0 + A1)$  
(For B0 see preferred form below)  
$B1 = \overline{SDI} * \overline{E0} * \overline{E1} * E2 = \overline{SDI} * (A2 + A3 * \bar{X})$  
$B2 = \overline{SDI} * \overline{E0} * E1 * \overline{E2} = \overline{SDI} * (A2 + A3 * \bar{X})$  
$B3 = \overline{E0} * \overline{E1} * E2 = (A6 + A7) * \bar{X}$  
$B4 = E0 * \overline{E1} * \overline{E2} = (A8 + A9)$  
$B5 = E0 * \overline{E1} * E2 = (A10 + A3 * X)$  
$B6 = E0 * E1 * \overline{E2} = (A4 + A5) * X$  
$B7 = E0 * E1 * E2 = (A6 + A7) * X$  
$B8 = SDI * \overline{E0} * \overline{E1} * \overline{E2} = SDI * (A0 + A1)$  
(For B8 see preferred form below)  
$B9 = SDI * \overline{E0} * \overline{E1} * E2 = SDI * (A2 + A3 * \bar{X})$  
$B10 = SDI * \overline{E0} * E1 * \overline{E2} = SDI * (A4 + A5) * \bar{X}$  
$BX = SDI * (E0 + E1 * E2) =$  
$\quad SDI * (A6 + A7 + A8 + A9 + A10 + X)$ Preferred forms for B0 and B8 to ensure turning on a latch when all have zeroes:  
$B0 = \overline{SDI} * \overline{A2} * \overline{A3} * \overline{A4} * \overline{A5} * \overline{A6} + \overline{A7} * \overline{A8} * \overline{A9} * \overline{A10})$  
$B8 = \overline{SDI} * (\overline{A2} * \overline{A3} * \overline{A4} * \overline{A5} * \overline{A6} * \overline{A7} * \overline{A8} * \overline{A9} * \overline{A10})$  
Derivation of Equations for Scan Inputs The derivation illustrated in Table II is based on the functions shown in FIG. 3, showing what functions appear on each signal after encoding, by shifting one and then decoding. It shows that it is simple to write the functions B0–B10 directly as functions of SDI, A0–A10, and X. Accordingly, an actual implementation does not require an explicit decoder, shifter, or encoder.

FIG. 4 shows the behavioral model for FIG. 3. The LSSD circuit 410 includes the 11 functional inputs D0–D10 and outputs A0–A10, which input to the encode circuit 338 and result from the decode circuit 342, respectively. The encode circuit 338 shows the encoding of the four independent signals E0–E3, which feed to their respective latches 412–418. Data is scanned into the first latch 412 and then to the next latch until the scanned data exits out of latch 418.

An alternative method of obtaining the direct output functions shown in Table II is from a state table, which would show the current state and the next state during scanning depending on the value of SDI.

Additionally, the embodiments discussed above have been directed towards latched signals that are orthogonal. These procedures can also be applied to any set of latches for which not all possible values can be allowed, either during functional operation of the chip or during scanning. In this event, a 1:1 correspondence is provided between the allowable sets of signals and the encoding of these sets. If the number of allowable sets is not a power of 2, then an X latch must be provided, as illustrated in FIG. 3 so that there is a correspondence for all possible scan-in patterns.

While the invention has been particularly shown and described with reference to a preferred embodiment, it will be understood by those skilled in the art that various changes in form and detail may be made therein without departing from the spirit and scope of the invention.

I claim:

1. A level sensitive scan design test circuit for use in an integrated circuit having a multiplexor, which has a plurality of pass gates, comprising:

a plurality of latches, each latch having a functional input, a scan input, and an output, said outputs being coupled to said multiplexor;

a means for placing a first set of mutually exclusive signals of said integrated circuit on said functional inputs of said plurality of latches for selecting one of said plurality of pass gates;

means, coupled to said outputs, for encoding said first set of mutually exclusive signals as a reduced set of signals;

means, coupled to said encoding means, for modifying said reduced set of signals;

means, coupled to said modifying means, for decoding said modified reduced set of signals and placing during testing said decoded modified reduced set of signals on said scan inputs of said plurality of latches;

means, coupled to said encoding means, for scanning out an output signal based on said reduced set of signals.

2. The invention according to claim 1 wherein said decoded modified reduced set of signals becomes a second set of mutually exclusive signals upon being scanned into said scan inputs.

3. The apparatus of claim 1 wherein said outputs bypass said encoding means during operation.

4. In a level sensitive scan design (LSSD) circuit for use in an integrated circuit having a multiplexor, which has a plurality of pass gates, said LSSD circuit further comprising a plurality of latches, each latch having a functional input, a scan input, and an output, said outputs being coupled to said multiplexor, and a signal decoder coupled to said outputs of said plurality of latches, a method of testing said LSSD comprising the steps of:

putting said integrated circuit into a test mode;

scanning a signal pattern into said signal decoder, said pattern being an encoding of a set of mutually exclusive signals used for selecting one of said plurality of pass gates in said multiplexor;

gating an output signal from said signal decoder into said plurality of latches, using said scan inputs of said plurality of latches;

putting said integrated circuit in a functional mode;

operating said integrated circuit in said functional mode for one or more cycles, thereby producing output signals from said multiplexor;

comparing said output signals with a set of expected values.

5. A level sensitive scan design for use in an integrated circuit having a multiplexor, which has a plurality of pass gates, comprising:

a plurality of latches, each latch having a functional input, a scan input, and an output, said outputs being coupled to said multiplexor;

a supplemental latch having a scan input and an output;

a means for placing a first set of mutually exclusive signals of said integrated circuit on said functional inputs of said plurality of latches for selecting one of said plurality of pass gates;

means, coupled to said outputs and said output of said supplemental latch, for encoding said first set of mutually exclusive signals as a reduced set of signals;

means, coupled to said encoding means, for modifying said reduced set of signals;

means, coupled to said modifying means, for decoding said modified reduced set of signals and for placing said decoded modified reduced set of signals on said scan inputs of said plurality of latches and for placing a signal on said scan input of said supplemental latch to allow for encoding of any possible set of signals that may be scanned into said circuit;

means for scanning out an output signal from said reduced set of signals.

6. The apparatus of claim 5 wherein said decoded modified reduced set of signals becomes a second set of mutually exclusive signals upon being scanned into said scan inputs.

7. The apparatus of claim 5 wherein said functional outputs bypass said encoding means during operation.

8. The apparatus of claim 5 wherein said integrated circuit is operated for one or more cycles in a functional mode, after which, said output signal is compared with an expected value.

* * * * *

UNITED STATES PATENT AND TRADEMARK OFFICE
CERTIFICATE OF CORRECTION

PATENT NO. : 5,528,601
DATED : June 18, 1996
INVENTOR(S) : Schmookler

It is certified that error appears in the above-indentified patent and that said Letters Patent is hereby corrected as shown below:

Column 5, line 49: insert --(-- before " $\overline{A2}$ "

Signed and Sealed this

Fifteenth Day of October, 1996

Attest:

BRUCE LEHMAN

*Attesting Officer*     *Commissioner of Patents and Trademarks*